(12) United States Patent
Bour et al.

(10) Patent No.: US 6,618,413 B2
(45) Date of Patent: Sep. 9, 2003

(54) GRADED SEMICONDUCTOR LAYERS FOR REDUCING THRESHOLD VOLTAGE FOR A NITRIDE-BASED LASER DIODE STRUCTURE

(75) Inventors: David P. Bour, Cupertino, CA (US); Michael A. Kneissl, Mountain View, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/024,239

(22) Filed: Dec. 21, 2001

(65) Prior Publication Data

US 2003/0118066 A1 Jun. 26, 2003

(51) Int. Cl.$^7$ .............................................. H01S 5/343
(52) U.S. Cl. .......................................................... 372/45
(58) Field of Search .......................................... 372/45

(56) References Cited

U.S. PATENT DOCUMENTS

| | | | |
|---|---|---|---|
| 5,170,407 A | * 12/1992 | Schubert et al. | 372/96 |
| 5,530,715 A | 6/1996 | Shieh et al. | 372/96 |
| 5,898,721 A | 4/1999 | He | 372/45 |

* cited by examiner

*Primary Examiner*—James Davie
(74) *Attorney, Agent, or Firm*—William Prupp

(57) ABSTRACT

Graded semiconductor layers between GaN and AlGaN layers in a nitride based semiconductor laser structure reduce the threshold voltage of the laser structure by reducing the electric potential barrier at the interface between the GaN and AlGaN layers. The graded layers can be step graded, continuous graded or digital graded.

10 Claims, 5 Drawing Sheets

GRADED SEMICONDUCTOR LAYERS FOR REDUCING THRESHOLD VOLTAGE FOR A NITRIDE-BASED LASER DIODE STRUCTURE

BACKGROUND OF THE INVENTION

The present invention relates to the threshold voltage for a nitride based laser diode structure and, more particularly, to graded semiconductor layers for reducing the threshold voltage of a nitride based laser diode structure.

Solid state lasers, also referred to as semiconductor lasers or laser diodes, are well known in the art. These devices generally consist of a planar multi-layered semiconductor structure having one or more active semiconductor layers. The active layers of the monolithic multi-layered laser structure are bounded at their side ends by cleaved surfaces that act as mirrors. Optical feedback is provided by the cleaved mirrors and a standing wave is formed between the mirrors in the laser resonator with a wave front parallel to the mirrors. If the optical gain produced in the active layers exceeds the optical loss in the laser structure amplified stimulated emission is produced and coherent laser light is emitted through the mirrored edges of the semiconductor laser structure.

The semiconductor layers on one side of the active layer in the structure are doped with impurities so as to have an excess of mobile electrons. These layers with excess electrons are said to be n-type, i.e. negative. The semiconductor layers on the other side of the active layer in the structure are doped with impurities so as to have a deficiency of mobile electrons, therefore creating an excess of positively charged carriers called holes. These layers with excess holes are said to be p-type, i.e. positive.

An electrical potential is applied through electrodes between the p-side and the n-side of the layered structure, thereby driving either holes or electrons or both in a direction perpendicular to the planar layers across the p-n junction so as to "inject" them into the active layers, where electrons recombine with holes to produce light.

The interface between adjacent semiconductor layers in the multi-layered structure can present barriers to the electrical potential. Threshold voltage is the minimum voltage applied between the two electrodes causing the active layers to emit light.

Nitride based semiconductors, also known as group III nitride semiconductors or Group III–V semiconductors, comprise elements selected from group III, such as Al, Ga and In, and the group V element N of the periodic table. The nitride based semiconductors can be binary compounds such as gallium nitride (GaN), as well as ternary alloys of aluminum gallium nitride (AlGaN) or indium aluminum nitride (InGaN), and quarternary alloys such as indium gallium aluminum nitride (InGaAlN). These materials are deposited on substrates to produce layered semiconductor structures usable as light emitters for optoelectronic device applications. Nitride based semiconductors have the wide bandgap necessary for short-wavelength visible light emission in the green to blue to violet to the ultraviolet spectrum.

These materials are particularly suited for use in short-wavelength light emitting devices for several important reasons. Specifically, the InGaAlN system has a large bandgap covering the entire visible spectrum. III–V nitrides also provide the important advantage of having a strong chemical bond which makes these materials highly stable and resistant to degradation under the high electric current and the intense light illumination conditions that are present at active regions of the devices. These materials are also resistant to dislocation formation once grown.

Semiconductor laser structures comprising nitride semiconductor layers grown on a sapphire substrate will emit light in the ultra-violet to visible spectrum within a range including 280 nm to 650 nm.

The shorter wavelength violet of nitride based semiconductor laser diodes provides a smaller spot size and a better depth of focus than the longer wavelength of red and infrared (IR) laser diodes for high-resolution or high-speed laser printing operations and high density optical storage. In addition, blue lasers can potentially be combined with existing red and green lasers to create projection displays and color film printers.

A prior art nitride based semiconductor laser structure 100 of FIG. 1 has a sapphire ($Al_2O_3$) substrate 102 on which is epitaxially deposited a succession of semiconductor layers. The sapphire substrate 102 typically has a thickness of 200 micron to 1000 micron.

The prior art laser structure 100 includes an n-type III–V nitride nucleation layer 104 formed on the sapphire substrate 102. Typically, the nucleation layer 104 is undoped GaN and has typically a thickness in, the range between 10 nm and 30 nm.

A III–V nitride contact layer 106 is formed on the nucleation layer 104. The III–V nitride layer 106 is an n-type GaN:Si layer acting as a lateral n-contact and current spreading layer. The contact and current spreading layer 106 typically has a thickness of from about 1 $\mu$m to about 20 $\mu$m.

A III–V nitride cladding layer 108 is formed over the contact layer 106. The III–V nitride layer 106 is an n-type AlGaN:Si cladding layer. The cladding layer 106 typically has a thickness of from about 0.2 $\mu$m to about 2 $\mu$m.

On top of the III–V nitride cladding layer 108, a III–V nitride waveguide layer 110 is formed followed by the III–V nitride quantum well active region 112. The n-type GaN:Si waveguide layer 110 typically has a thickness of from about 50 nm to about 200 nm. The quantum well active region 112 is comprised of at least one InGaN quantum well. For multiple-quantum well active regions, the individual quantum wells typically have a thickness of from about 10 Å to about 100 Å and are separated by InGaN or GaN barrier layers which have typically a thickness of from about 10 Å to about 200 Å.

A III–V nitride tunnel barrier layer 114 is formed over the quantum well active region 112. The p-type AlGaN:Mg tunnel barrier layer 114 serves as electron blocking layer and carrier confinement layer to keep electrons from leaking out of the active region 112 and has a thickness of from 15 nm to 20 nm.

A III–V nitride waveguide layer 116 is formed over the tunnel barrier layer 114. The p-type GaN:Mg layer 116 serves as a waveguide layer and has a thickness of from about 50 nm to about 200 nm.

A III–V nitride cladding layer 118 is formed over the waveguide layer 116. The p-type AlGaN:Mg layer 118 serves as a cladding and current confinement layer. The III–V nitride cladding layer 118 typically has a thickness of from about 0.2 $\mu$m to about 1 $\mu$m.

A III–V nitride contact layer 120 is formed over the cladding layer 118. The p-type GaN:Mg layer 120 forms a p-contact layer for the minimum-resistance metal electrode to contact the p-side of the laser heterostructure 100. The III–V nitride contact layer 120 typically has a thickness of from about 10 nm to 200 nm.

The laser structure 100 can be fabricated by a technique such as metalorganic chemical vapor deposition (MOCVD) or molecular beam epitaxy as is well known in the art.

Dry-etching using CAIBE (chemical assisted ion beam etching) or RIE (reactive ion beam etching) in an Ar/Cl$_2$/BCl$_3$ gas mixture is used to etch the prior art laser structure 100 down to the GaN:Si current-spreading layer 106.

An n-type Ti/Al electrode 122 is formed on the etched, exposed n-current-spreading layer 106 of the laser 100, which is functioning as a lateral contact layer. A p-type Ni/Au electrode 124 is formed on the p-contact layer 120 of the laser 100.

The threshold voltage to cause light emission for nitride based semiconductor lasers is relatively high. AlGaInN laser devices have threshold currents in the order of 50 mA and operating voltages of 5 V, compared to about 15 mA and 2.5 V for AlGaAs red laser devices.

This problem is related to carrier injection across internal heterostructure semiconductor layer interfaces where an electrical potential barrier is created within the valence band or conduction band at the interface between nitride based semiconductor layers.

Specifically, when charge carriers such as holes are injected across the interface between a gallium nitride GaN semiconductor layer into an aluminum gallium nitride AlGaN semiconductor layer in a nitride based laser structure, an interfacial potential barrier hinders hole injection across that barrier. As a result of the valence band offset between these two materials, along with the accompanying charge transfer from the high bandgap material (AlGaN) to the low bandgap material (GaN), a triangular potential barrier is created at the interface 126 between the GaN layer 120 and the AlGaN layer 118 as shown in FIG. 2. The barrier thickness and barrier height depend on the band offset at the interface along with the acceptor concentration in the AlGaN and GaN layers. The barrier width is essentially the depletion width of the AlGaN/GaN interface. In order to traverse this potential barrier, holes must either be emitted over the potential barrier, or they may tunnel through the potential barrier. If the tunneling probability is low, then emission over the barrier requires that a voltage must be applied across the interface, in order to support hole injection across the potential barrier. As a result, when such a potential barrier is present in a semiconductor laser structure, the total voltage is increased as shown in FIG. 3. It is essential to minimize these potential barriers to reduce the laser diode threshold voltage. Otherwise, the ensuing transient heating will preclude continuous-wave operation, limiting the nitride based laser structure to only pulsed operation.

The conventional nitride based laser structure 100 contains two internal AlGaN/GaN interfaces, where holes are injected from a low bandgap GaN:Mg layer into a higher bandgap AlGaN:Mg layer. First, holes must be injected from the GaN:Mg contact layer 120 into the AlGaN:Mg cladding layer 118 at interface 126. A similar situation also arises at the n-cladding layer interface where holes must be injected from the GaN:Si waveguide layer 110 into the AlGaN:Si cladding layer 108. Second, holes must also be injected across a high aluminum content (typically 20% Al) AlGaN:Mg tunnel barrier layer 114 placed over the multiple quantum well active region 112 at interface 128. The purpose of this tunnel barrier layer is to prevent injected electrons from leaking out of the quantum wells in the active region, as shown in FIG. 4.

In a nitride based semiconductor laser, internal interfacial potential barriers between a GaN semiconductor layer and an AlGaN semiconductor layer lead to high laser diode threshold voltages. For example, when the aluminum content of the AlGaN tunnel barrier layer is increased from 20% to 30% Al, the laser threshold voltage increases. On the other hand, the high temperature performance of the laser is improved when the aluminum content is increased. Similarly, increasing the aluminum content improves the carrier and optical confinement of the AlGaN layer in the nitride based laser structure. Thus, it appears that the tunnel barrier layer does, in fact, suppress electron leakage, although at the expense of higher diode voltage. This performance enhancement must still be traded off against the higher diode threshold voltage. Although it is possible to reduce the threshold and its temperature dependence by increasing the Al content, the additional voltage drop required to inject holes across the potential barrier would cause transient heating, so that continuous-wave operation may still be extremely difficult.

It is an object of this invention to provide graded semiconductor layers to reduce the threshold voltage of a nitride based semiconductor laser structure.

SUMMARY OF THE INVENTION

According to the present invention, graded semiconductor layers between GaN and AlGaN layers in a nitride based semiconductor laser structure reduce the threshold voltage of the laser structure by reducing the electric potential barrier at the interface between the GaN and AlGaN layers.

The graded semiconductor layers can be a plurality of AlGaN layers with increasing aluminum content to form step graded layers between the GaN and AlGaN layers. A continuous graded semiconductor layer will linearly increase the aluminum content in a single layer between the GaN and AlGaN layers. A digital grading semiconductor layer will have a superlattice of alternating GaN and AlGaN layers with the GaN quantum wells decreasing in thickness as the AlGaN barriers increase in thickness between the GaN and AlGaN layers.

The GaN semiconductor layer and the adjacent AlGaN semiconductor layer can be cladding and contact layers or active region and tunnel barrier layer in the nitride based semiconductor laser structure.

Other objects and attainments together with a fuller understanding of the invention will become apparent and appreciated by referring to the following description and claims taken in conjunction with the accompanying drawings.

DESCRIPTION OF THE INVENTION

Figure 5:
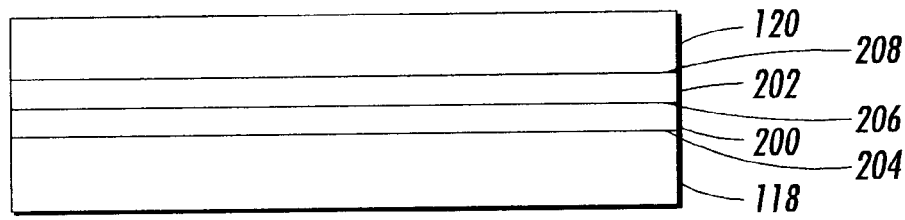
FIG. 5 is a side view of step grading semiconductor layers between GaN and AlGaN semiconductor layers of the present invention.

Reference is now made to FIG. 5, wherein there is illustrated step grading semiconductor layers 200 and 202 between GaN and AlGaN semiconductor layers in a nitride based semiconductor laser to reduce the threshold voltage of the laser structure by reducing the electric potential barrier at the interface between the GaN and AlGaN layers in accordance with this invention.

Using the nitride based semiconductor laser 100, the $Al_{0.09}Ga_{0.91}N$:Mg cladding layer 118 typically has a thickness of from about 0.2 $\mu$m to about 1 $\mu$m.

A first step grading layer 200 is formed on the $Al_{0.09}Ga_{0.91}N$:Mg cladding layer 118. The first step grading layer 200 will have a chemical composition of $Al_{0.06}Ga_{0.94}N$:Mg and a thickness of 10 nm The first step grading layer 200 shares the same p-doping as the cladding layer 118. The first step grading layer 200 and the cladding layer 118 have a layer interface 204.

A second step grading layer 202 is formed on the first $Al_{0.06}Ga_{0.94}N$:Mg step grading layer 200. The second step grading layer will have a chemical composition of $Al_{0.03}Ga_{0.97}N$:Mg and a thickness of 10 nm The second step grading layer 202 shares the same p-doping as the cladding layer 118 and the first step grading layer 200. The second step layer 202 and the first step layer 200 have a layer interface 206.

The GaN:Mg contact layer 120 is formed over the second step grading layer 202. The GaN:Mg contact layer 120 typically has a thickness of from about 10 nm to 200 nm and shares the same p-doping as the cladding layer 118, the first step grading layer 200 and the second step grading layer 202. The contact layer 120 and the second step layer 202 have a layer interface 208.

Figure 6:
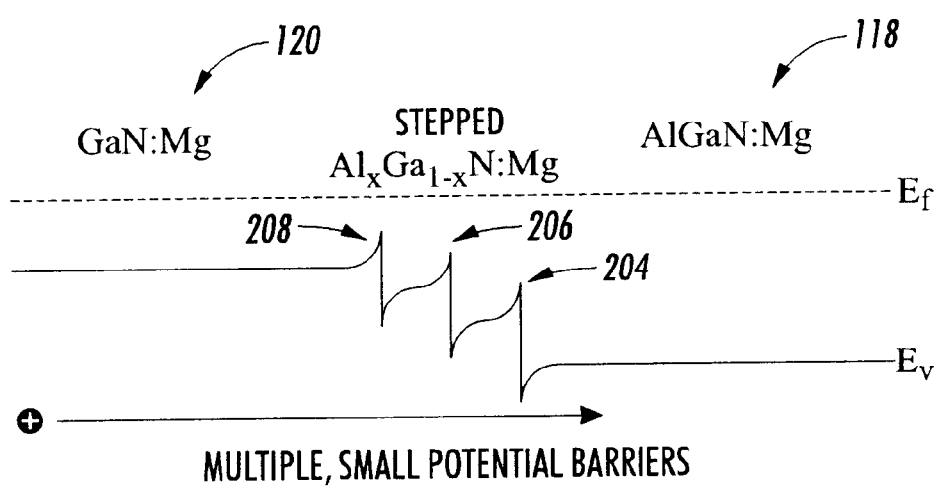
FIG. 6 is a graph of the valance band structure at an step-graded Mg-doped GaN/AlGaN interface according to the step grading semiconductor layers between GaN and AlGaN semiconductor layers of FIG. 5.

Step grading semiconductor layers 200 and 202 between GaN and AlGaN semiconductor layers in a nitride based semiconductor laser reduce the threshold voltage while still preserving the benefits of high bandgap AlGaN layers in nitride laser structures. A single interface 126 from FIG. 1 and resulting large potential barrier in FIG. 2 is divided into three interfaces 204, 206, 208 from FIG. 5 with a smaller potential barrier at each interface as shown in FIG. 6. These smaller potential barriers facilitate hole injection, thereby lowering threshold voltage compared to the single interface.

The use of two step grading semiconductor layers to facilitate hole injection between GaN and AlGaN semiconductor layers is merely an illustrative example. The number of step grading layers can vary. The larger the number of step grading layers, the smaller the potential barrier is at the interface between adjacent step grading layers. Presuming n step grading layers between the GaN layer and the $Al_xGa_{1-x}N$ layer, then the aluminum content of the mth grading layer will be $Al_AGa_BN$ where A equals (mX)/n and B equals 1−(mX)/n. The difference in aluminum content between step grading layers will be constant.

The step grading layers can also be used between the quantum well active region 112 and the adjacent AlGaN tunnel barrier layer 114 layers in a nitride based semiconductor laser to reduce the threshold voltage of the laser structure by reducing the electric potential barrier at the interface between the GaN and AlGaN layers.

Figure 7:
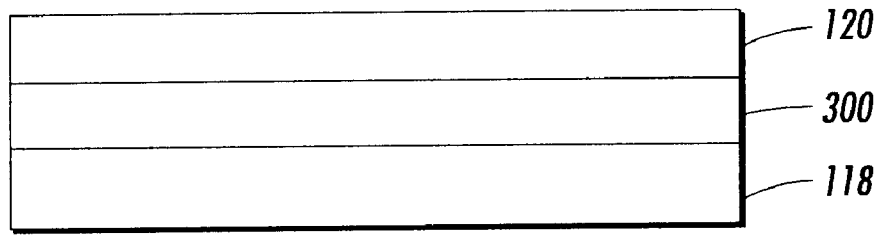
FIG. 7 is a side view of a continuous graded semiconductor layer between GaN and AlGaN semiconductor layers of the present invention.

Reference is now made to FIG. 7, wherein there is illustrated a continuous grading semiconductor layer 300 between GaN and AlGaN semiconductor layers in a nitride based semiconductor laser layers to reduce the threshold voltage of the laser structure by reducing the electric potential barrier at the interface between the GaN and AlGaN layers in accordance with this invention.

Using the nitride based semiconductor laser 100, the $Al_{0.09}Ga_{0.91}N$:Mg cladding layer 118 typically has a thickness of from about 0.2 $\mu$m to about 1 $\mu$m.

A continuous grading layer 300 is formed on the $Al_{0.09}Ga_{0.91}N$:Mg cladding layer 118. The continuous grading layer 300 will have a chemical composition of $Al_xGa_{1-x}N$:Mg, where x varies from 0.09 to 0.0, and a thickness of 20 nm. The continuous grading layer 300 shares the same p-doping as the cladding layer 118.

The GaN:Mg contact layer 120 is formed over the continuous grading layer 300. The GaN:Mg contact layer 120 typically has a thickness of from about 10 nm to 200 nm and shares the same p-doping as the cladding layer 118 and the continuous grading layer 300.

The aluminum content of the $Al_xGa_{1-x}N$:Mg continuous grading layer 300 will decrease linearly with the thickness of the grading layer from a maximum aluminum content of 0.09 at the $Al_{0.09}Ga_{0.91}N$:Mg cladding layer matching the aluminum content of the cladding layer to a minimum aluminum content (a vanishing aluminum content of zero) of 0.0 at the contact layer matching the aluminum content of the GaN contact layer.

The aluminum content of the $Al_xGa_{1-x}N$:Mg continuous grading layer 300 varies as a gradient between the cladding layer and the contact layer, thereby gradually bridging the aluminum content from the cladding layer to the contact layer. Thus by bridging the cladding layer and the contact layer with the continuous grading layer, a lower potential barrier and a lower threshold voltage are achieved for the nitride semiconductor laser structure.

Continuous grading semiconductor layer 300 between GaN and AlGaN semiconductor layers in a nitride based semiconductor laser reduces the threshold voltage while still preserving the benefits of high bandgap AlGaN layers in nitride laser structures.

Figure 1:
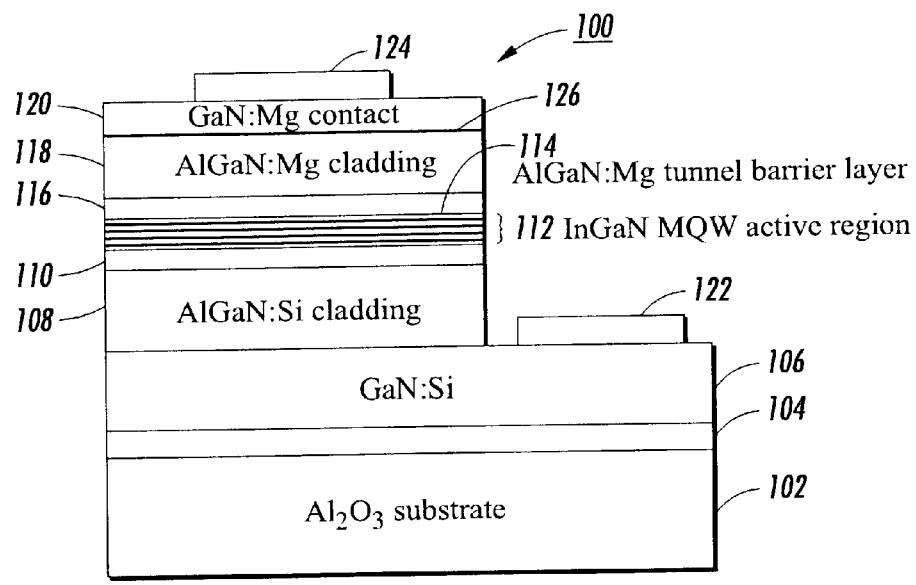
FIG. 1 is a side view of a prior art nitride based semiconductor laser structure.
Figure 2:
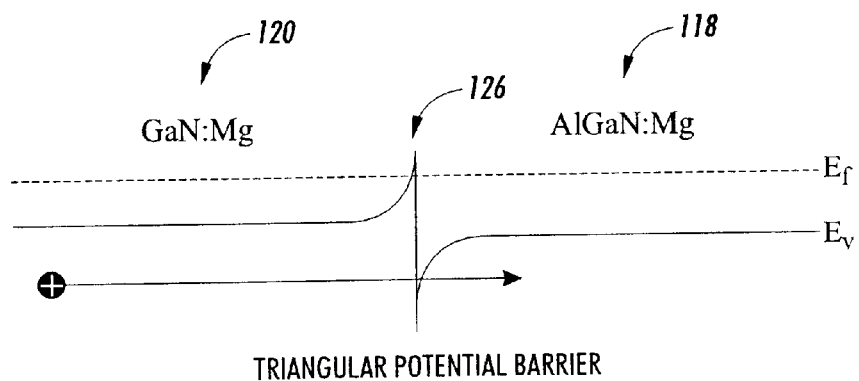
FIG. 2 shows the valance band structure at an Mg-doped GaN/AlGaN interface according to the prior art nitride based semiconductor laser structure of FIG. 1, in which the potential barrier is impeding hole injection.
Figure 3:
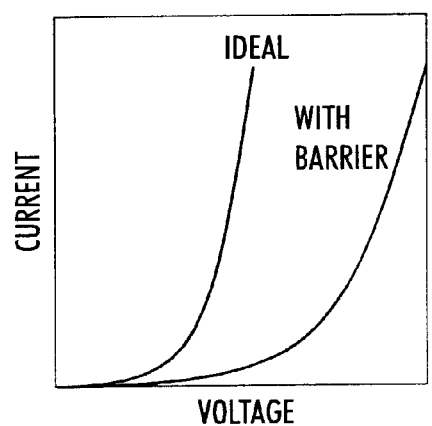
FIG. 3 is a graph of current versus voltage for the ideal nitride based semiconductor laser structure versus the prior art nitride based semiconductor laser structure of FIG. 1.
Figure 4:
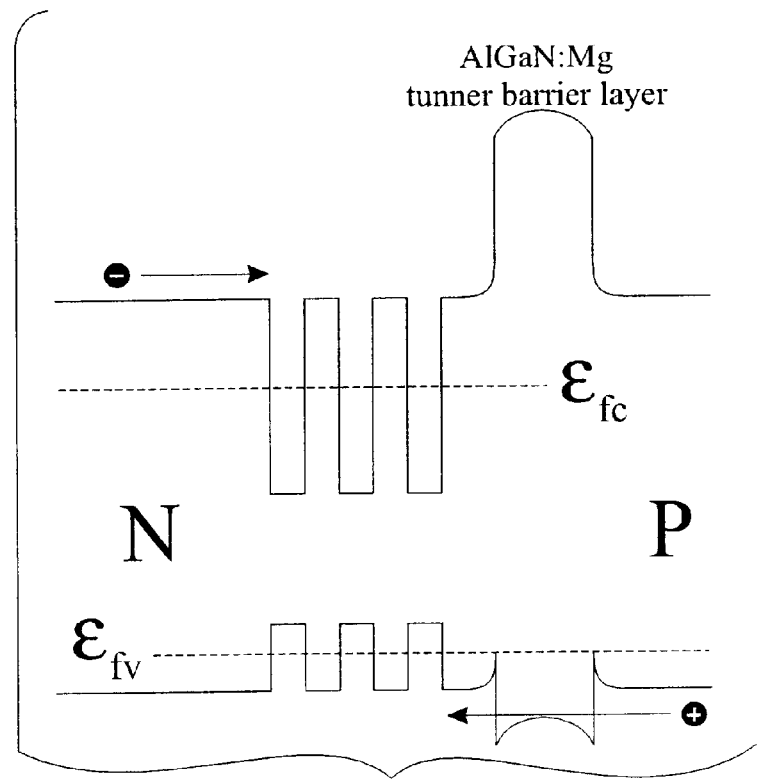
FIG. 4 is a graph of the band structure of the tunnel barrier layer and the multiple quantum well active region in the prior art nitride based semiconductor laser structure of FIG. 1 in which the potential barrier is impeding hole injection between the tunnel barrier layer and the multiple quantum well active region
Figure 8:
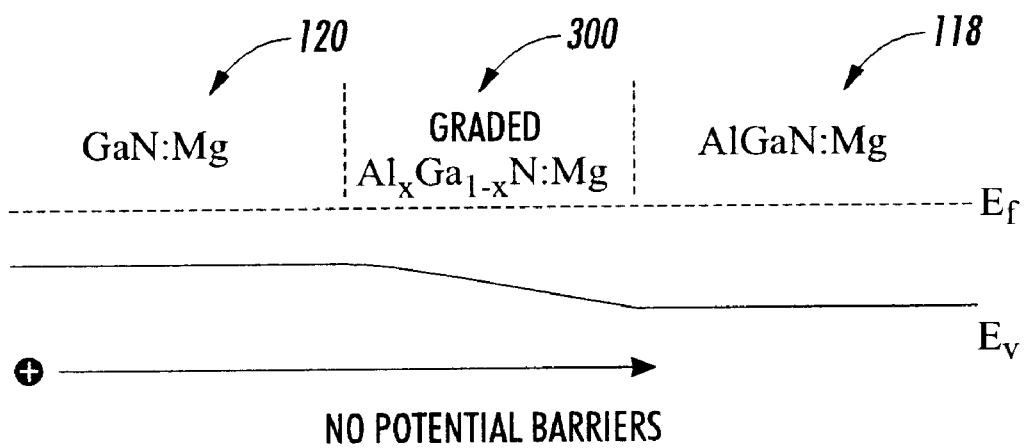
FIG. 8 is a graph of the valance band structure of a continuous grading semiconductor layer between GaN and AlGaN semiconductor layers of FIG. 7.

A single interface 126 from FIG. 1 and resulting large potential barrier in FIG. 2 is replaced with a continuously graded interface 300 of FIG. 7 so that the interfacial potential barrier may be eliminated as shown in FIG. 8. This facilitates hole injection, thereby lowering threshold voltage compared to the single interface. In MOCVD growth of the multi-layered nitride laser structure, continuous grading of the AlGaN layer is a straightforward procedure.

The continuous grading layer can also be used between the waveguide layer 116 and the adjacent AlGaN tunnel barrier layer 114 layers in a nitride based semiconductor laser to reduce the threshold voltage of the laser structure by reducing the electric potential barrier at the interface between the GaN and AlGaN layers.

Figure 9:
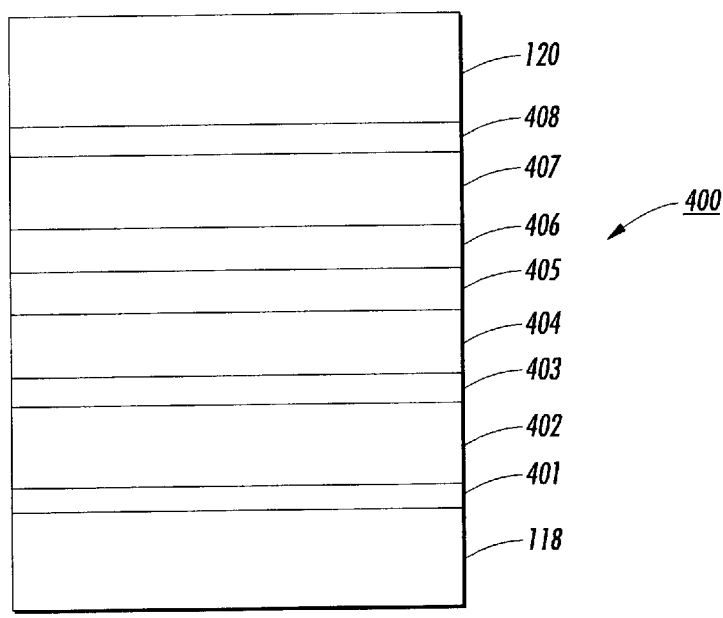
FIG. 9 is a side view of a digital graded semiconductor layer between GaN and AlGaN semiconductor layers of the present invention.

Reference is now made to FIG. 9, wherein there is illustrated a digital grading semiconductor layer 400 of alternating GaN and AlGaN semiconductor layers of different thicknesses between the GaN and AlGaN semiconductor layers in a nitride based semiconductor laser layers to reduce the threshold voltage of the laser structure by reducing the electric potential barrier at the interface between the GaN and AlGaN layers in accordance with this invention.

Using the nitride based semiconductor laser 100, the $Al_{0.09}Ga_{0.91}N$:Mg cladding layer 118 typically has a thickness of from about 0.2 µm to about 1 µm.

A digital grading layer 400 is formed on the $Al_{0.09}Ga_{0.91}N$:Mg cladding layer 118. The digital grading layer 400 will have a superlattice of alternating $Al_{0.09}Ga_{0.91}N$:Mg layers and GaN:Mg layers. The digital grading layer 400 shares the same p-doping as the cladding layer 118.

The GaN:Mg contact layer 120 is formed over the digital grading layer 400. The GaN:Mg contact layer 120 typically has a thickness of from about 10 nm to 200 nm and shares the same p-doping as the cladding layer 118 and the digital grading layer 400.

The digital grading layer 400 has four GaN:Mg layers 401, 403, 405 and 407. Each GaN:Mg layer is of a different thickness and of increasing thickness across the digital grading layer 400 from the $Al_{0.3}Ga_{0.7}N$:Mg cladding layer 118 to the GaN contact layer 120. As a specific example, the thickness of the first GaN quantum well 402 may be 5 angstroms, the thickness of the second GaN quantum well 404 may be 10 angstroms, the thickness of the third GaN quantum well 406 may be 20 angstroms and the thickness of the fourth GaN quantum well 408 may be 40 angstroms. The GaN quantum 401, 403, 405 and 407 are separated by $Al_{0.3}Ga_{0.7}N$:Mg barrier layers 402, 404, 406 and 408. Each barrier layer is of a different thickness and of decreasing thickness across the digital grading layer 400 from the $Al_{0.3}Ga_{0.7}N$:Mg cladding layer 118 to the GaN contact layer 120. As a specific example, the thickness of the first $Al_{0.3}Ga_{0.7}N$ barrier layer 402 may be 20 angstroms, the thickness of the second $Al_{0.3}Ga_{0.7}N$ barrier layer 404 may be 15 angstroms, the thickness of the third $Al_{0.3}Ga_{0.7}N$ barrier layer 406 may be 10 angstroms, and the thickness of the fourth $Al_{0.3}Ga_{0.7}N$ barrier layer 408 may be 5 angstroms.

The digital grading layer 400 from the $Al_{0.3}Ga_{0.7}N$:Mg cladding layer 118 to the GaN contact layer 120 consists of quantum well layer 401, barrier layer 402, quantum well layer 403, barrier layer 404, quantum well layer 405, barrier layer 406, quantum well layer 407, and barrier layer 408.

The digital grading layer 400 has GaN quantum wells 401, 403, 405 and 407 of increasing thickness alternating with $Al_{0.3}Ga_{0.7}N$ barrier layers 402, 404, 406 and 408 of decreasing thickness from the $Al_{0.3}Ga_{0.7}N$ cladding layer 118 to the GaN contact layer 120.

Figure 10:
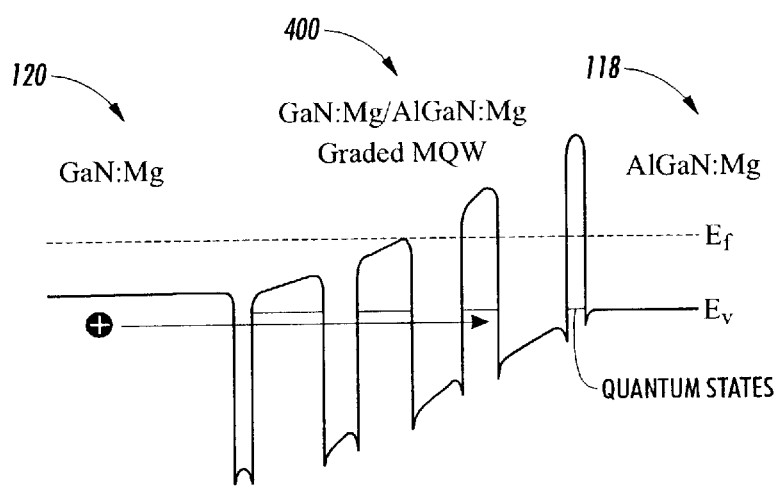
FIG. 10 is a graph of the valance band structure of the digital grading semiconductor layer between GaN and AlGaN semiconductor layers of FIG. 9.

The thickness of thin GaN layers and AlGaN barriers may be digital graded to simulate a continuously graded layer. Most importantly, if these layer thicknesses are adjusted properly, the hole injection across this interface can be enhanced by resonant tunneling. Resonant tunneling through the individual barrier layers occurs when the incident hole energy is resonant with the energy of a quantized state in the opposite well layer. If the digitally graded superlattice is graded properly, so that quantum subband energies for all the well layers are roughly degenerate, the hole injection can be enhanced. This resonant tunneling effect is illustrated in FIG. 10 The digital grading layer can also be used between the waveguide layer 116 and the adjacent AlGaN tunnel barrier layer 114 layers in a nitride based semiconductor laser to reduce the threshold voltage of the laser structure by reducing the electric potential barrier at the interface between the GaN and AlGaN layers.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A semiconductor laser structure comprising:

a substrate;

a plurality of III–V nitride semiconductor layers formed on said substrate, at least one of said plurality of III–V nitride semiconductor layers forms an active region, wherein a sufficient voltage is applied to said plurality of III–V nitride semiconductor layers to inject electron and holes into said active region to cause lasing from said semiconductor laser structure, and at least one of said plurality of III–V nitride semiconductor layers being an $Al_xGa_{1-x}N$ layer, at least one of said plurality of III–V nitride semiconductor layers being an $Al_yGa_{1-y}N$ layer, where 0<=x<y<=1, at least one graded semiconductor layer between said an $Al_xGa_{1-x}N$ layer and said $Al_yGa_{1-y}N$ layer, said at least one graded semiconductor layer having an aluminum content less than said $Al_yGa_{1-y}N$ layer but more than said an $Al_xGa_{1-x}N$ layer, wherein said at least one graded semiconductor layer reduces the electrical potential barrier between said an $Al_xGa_{1-x}N$ layer and said $Al_yGa_{1-y}N$ layer which reduces the threshold voltage necessary to cause lasing from said semiconductor laser structure.

2. The semiconductor laser structure of claim 1 wherein said at least one graded semiconductor layer further comprises at least two step graded semiconductor layers.

3. The semiconductor laser structure of claim 2 wherein the aluminum content of said at least two step graded semiconductor layers increases from said $Al_xGa_{1-x}N$ layer to said $Al_yGa_{1-y}N$ layer.

4. The semiconductor laser structure of claim 1 wherein said at least one graded semiconductor layer is a continuous graded semiconductor layer.

5. The semiconductor laser structure of claim 4 wherein the aluminum content of said continuous graded semiconductor layer increases from said $Al_xGa_{1-x}N$ layer to said $Al_yGa_{1-y}N$ layer.

6. The semiconductor laser structure of claim 1 wherein said at least one graded semiconductor layer is a digital graded semiconductor layer having a superlattice of alternating $Al_xGa_{1-x}N$ semiconductor quantum wells and $Al_yGa_{1-y}N$ semiconductor barriers of different thicknesses.

7. The semiconductor laser structure of claim 6 wherein said alternating $Al_yGa_{1-y}N$ semiconductor quantum wells decrease in thickness from said $Al_xGa_{1-x}N$ layer to said $Al_yGa_{1-y}N$ layer and said alternating $Al_xGa_{1-x}N$ semiconductor barriers increase in thickness from said $Al_xGa_{1-x}N$ layer to said $Al_yGa_{1-y}N$ layer.

8. The semiconductor laser structure of claim 1 wherein said $Al_yGa_{1-y}N$ layer is a cladding layer and said $Al_xGa_{1-x}N$ layer is a contact layer.

9. The semiconductor laser structure of claim 1 wherein said $Al_yGa_{1-y}N$ layer is a tunnel barrier layer and said $Al_xGa_{1-x}N$ layer is said waveguide layer.

10. The semiconductor laser structure of claim 1 wherein said substrate is sapphire, silicon carbide, spinel, aluminum nitride or gallium nitride.

\* \* \* \* \*